United States Patent
Kodama et al.

(10) Patent No.: US 9,543,265 B2
(45) Date of Patent: Jan. 10, 2017

(54) JOINT MATERIAL, AND JOINTED BODY

(71) Applicant: Hitachi, Ltd., Chiyoda-ku, Tokyo (JP)

(72) Inventors: Motomune Kodama, Tokyo (JP); Takashi Naito, Tokyo (JP); Tadashi Fujieda, Tokyo (JP); Yuichi Sawai, Tokyo (JP); Takuya Aoyagi, Tokyo (JP); Masanori Miyagi, Tokyo (JP)

(73) Assignee: Hitachi, Ltd., Tokyo (JP)

(*) Notice: Subject to any disclaimer, the term of this patent is extended or adjusted under 35 U.S.C. 154(b) by 47 days.

(21) Appl. No.: 14/178,847

(22) Filed: Feb. 12, 2014

(65) Prior Publication Data
US 2014/0287227 A1    Sep. 25, 2014

(30) Foreign Application Priority Data

Mar. 25, 2013   (JP) ................................. 2013-061762

(51) Int. Cl.
*H01F 3/00*     (2006.01)
*H01L 23/00*    (2006.01)
(Continued)

(52) U.S. Cl.
CPC ............. *H01L 24/29* (2013.01); *C04B 35/645* (2013.01); *C04B 37/026* (2013.01); *H01L 24/27* (2013.01); *H01L 24/32* (2013.01); *H01L 24/83* (2013.01); *C04B 2237/10* (2013.01); *C04B 2237/12* (2013.01); *C04B 2237/125* (2013.01); *C04B 2237/343* (2013.01); *C04B 2237/365* (2013.01); *C04B 2237/366* (2013.01); *C04B 2237/368* (2013.01); *C04B 2237/407* (2013.01);
(Continued)

(58) Field of Classification Search
None
See application file for complete search history.

(56) References Cited

U.S. PATENT DOCUMENTS 4,945,071 A * 7/1990 Friesen .................. C03C 3/122
                                                  106/1.14
5,077,244 A * 12/1991 Iyori et al. ................. 501/98.4
(Continued)

FOREIGN PATENT DOCUMENTS

DE     4128804    *  3/1992  ............. C03C 3/122
EP     0393416    *  4/1990  ............. C03C 3/12
(Continued)

OTHER PUBLICATIONS

Taiwanese Office Action dated Apr. 8, 2015 (four pages).

*Primary Examiner* — Humera Sheikh
*Assistant Examiner* — Seth Dumbris
(74) *Attorney, Agent, or Firm* — Crowell & Moring LLP

(57) ABSTRACT

Disclosed is a jointed body wherein multiple base members are jointed to each other through a jointing layer, and at least one of the base members is a base member of a ceramic material, semiconductor or glass. The joint material layer contains a metal and an oxide. The oxide contains V and Te, and is present between the metal and the base members. Disclosed is also a joint material in the form of a paste containing an oxide glass containing V and Te, metal particles, and a solvent; in the form of a foil piece or plate in which particles of an oxide glass containing V and Te are embedded; or in the form of a foil piece or plate containing a layer of an oxide glass containing V and Te, and a layer of a metal.

7 Claims, 10 Drawing Sheets

(51) Int. Cl.
*C04B 35/645* (2006.01)
*C04B 37/02* (2006.01)

(52) U.S. Cl.
CPC .... *C04B 2237/55* (2013.01); *C04B 2237/708* (2013.01); *C04B 2237/72* (2013.01); *C04B 2237/86* (2013.01); *H01L 2224/2731* (2013.01); *H01L 2224/29082* (2013.01); *H01L 2224/29109* (2013.01); *H01L 2224/29111* (2013.01); *H01L 2224/29113* (2013.01); *H01L 2224/29118* (2013.01); *H01L 2224/29124* (2013.01); *H01L 2224/29139* (2013.01); *H01L 2224/29144* (2013.01); *H01L 2224/29147* (2013.01); *H01L 2224/29169* (2013.01); *H01L 2224/29209* (2013.01); *H01L 2224/29211* (2013.01); *H01L 2224/29213* (2013.01); *H01L 2224/29218* (2013.01); *H01L 2224/29224* (2013.01); *H01L 2224/29239* (2013.01); *H01L 2224/29244* (2013.01); *H01L 2224/29247* (2013.01); *H01L 2224/29269* (2013.01); *H01L 2224/29288* (2013.01); *H01L 2224/29294* (2013.01); *H01L 2224/29309* (2013.01); *H01L 2224/29311* (2013.01); *H01L 2224/29313* (2013.01); *H01L 2224/29318* (2013.01); *H01L 2224/29324* (2013.01); *H01L 2224/29339* (2013.01); *H01L 2224/29344* (2013.01); *H01L 2224/29347* (2013.01); *H01L 2224/29369* (2013.01); *H01L 2224/32013* (2013.01); *H01L 2224/32225* (2013.01); *H01L 2224/32245* (2013.01); *H01L 2224/32505* (2013.01); *H01L 2224/83055* (2013.01); *H01L 2224/83075* (2013.01); *H01L 2224/8384* (2013.01); *H01L 2224/83101* (2013.01); *H01L 2224/83191* (2013.01); *H01L 2224/83192* (2013.01); *H01L 2224/83193* (2013.01); *H01L 2224/83203* (2013.01); *H01L 2224/83487* (2013.01); *H01L 2224/83801* (2013.01); *H01L 2924/15788* (2013.01); *H01L 2924/351* (2013.01); *Y10T 428/265* (2015.01)

(56) References Cited

U.S. PATENT DOCUMENTS

| | | | | |
|---|---|---|---|---|
| 5,183,784 | A | * | 2/1993 | Nguyen et al. ................. 501/19 |
| 5,188,990 | A | * | 2/1993 | Dumesnil et al. ............. 501/19 |
| 5,543,366 | A | * | 8/1996 | Dietz ...................... C03C 3/122 |
| | | | | 106/1.14 |
| 6,444,297 | B1 | * | 9/2002 | Bischel ......................... 428/209 |
| 8,470,723 | B2 | | 6/2013 | Naito et al. |
| 2009/0247385 | A1 | * | 10/2009 | Ide .......................... C03C 3/066 |
| | | | | 501/18 |
| 2013/0042912 | A1 | | 2/2013 | Kurihara et al. |
| 2014/0145122 | A1 | * | 5/2014 | Sawai ..................... H01J 29/90 |
| | | | | 252/514 |

FOREIGN PATENT DOCUMENTS

| | | | |
|---|---|---|---|
| EP | 0 463 826 A1 | 1/1992 | |
| JP | 4-270140 A | 9/1992 | |
| JP | H05175254 | * 7/1993 | ............ H01L 21/52 |
| JP | 2010-184852 A | 8/2010 | |
| JP | 2012-169355 A | 9/2012 | |
| JP | 2013-32255 A | 2/2013 | |
| JP | 2013-151396 A | 8/2013 | |
| TW | 201036929 A1 | 10/2010 | |
| TW | 201242761 A1 | 11/2012 | |
| TW | 201309410 A1 | 3/2013 | |
| WO | WO 2013/024829 A1 | 2/2013 | |

* cited by examiner

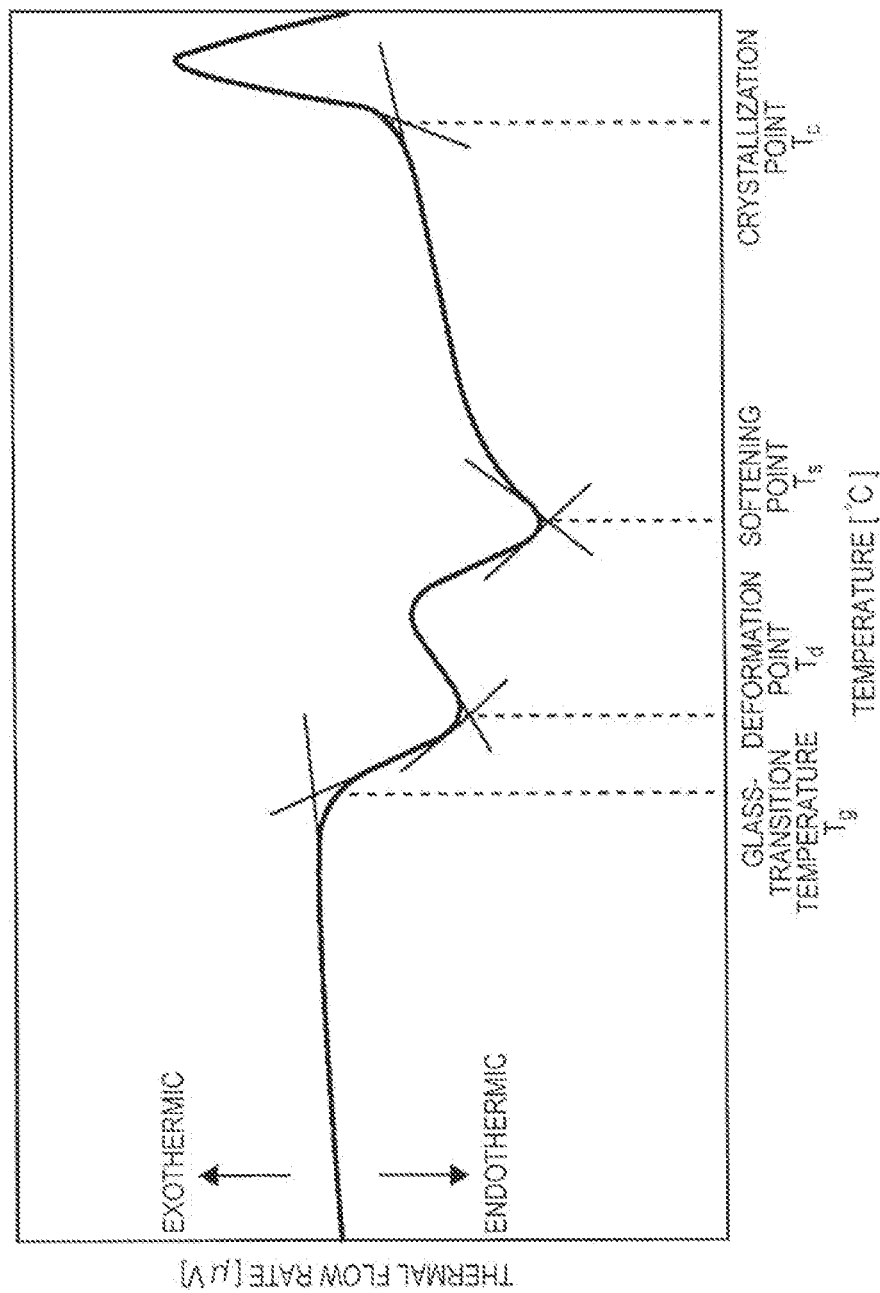

JOINT MATERIAL, AND JOINTED BODY

BACKGROUND OF THE INVENTION

1. Field of the Invention

The present invention relates to a joint material applicable to a jointed body in which a base member of, for example, a ceramic material, a semiconductor or a glass is jointed to another base member.

2. Description of the Related Art

An electrical or electronic component, an LED illuminator or a semiconductor module has a spot where a base member such as a ceramic member, a glass piece, a metal member or a semiconductor chip is jointed to another base member. This jointed spot may have a function as a thermal flow path or current path. At such a jointed spot, base members as described above are usually jointed to each other through a solder or brazing filler metal.

JP 04-270140 A discloses that about a silver-glass paste for jointing a semiconductor device to a ceramic base member, the firing temperature thereof is from 300 to 420° C. A basic composition of the glass is a composition composed of lead oxide and vanadium oxide.

When a solder is used to joint a base member of a ceramic material, a semiconductor, a glass or some other, metalization is required to make the entire process complicated and further a liquid waste disposal treatment is also required. About a brazing filler metal containing an active metal such as Ti (titanium) or Al (aluminum), a joint of a ceramic member can be attained without conducting any metalization. However, a treatment at a high temperature of 800° C. is required. For this reason, a technique is desired which makes it possible to joint a base member of a ceramic material, a semiconductor, a glass or some other at a low temperature of about 300° C. without conducting any metalization.

SUMMARY OF THE INVENTION

An object of the invention is to provide a technique capable of jointing a base member of a ceramic material, a semiconductor, a glass or some other at substantially the same treatment temperature as used for a solder without conducting any metalization.

A typical aspect of the invention is briefly as follows:

A jointed body, wherein multiple base members are jointed to each other through a jointing layer, at least one of the base member is a ceramic base member, a semiconductor base member or a glass base member, the joint material layer includes a metal and an oxide, the oxide comprises V and Te, and the oxide is present between the first base member and the metal.

According to the invention, it is possible to joint a base member of a ceramic material, a semiconductor, a glass or some other at substantially the same treatment temperature as used for a solder without conducting any metalization.

BRIEF DESCRIPTION OF THE DRAWINGS

FIG. 1 is a graph showing a typical DTA curve of a glass composition;

DESCRIPTION OF THE PREFERRED EMBODIMENTS

Hereinafter, the invention will be described about embodiments, examples and modified examples thereof with reference to the attached drawings. In the description, the same reference numbers are attached to the same constituent elements, respectively; accordingly, repeated descriptions are omitted thereabout. The invention is not limited to the embodiments, examples and modified examples described in the specification. Thus, these may each be modified, or any two or more thereof may be appropriately combined with each other as far as the resultant does not depart from the scope of the invention.

EMBODIMENTS

Figure 10:
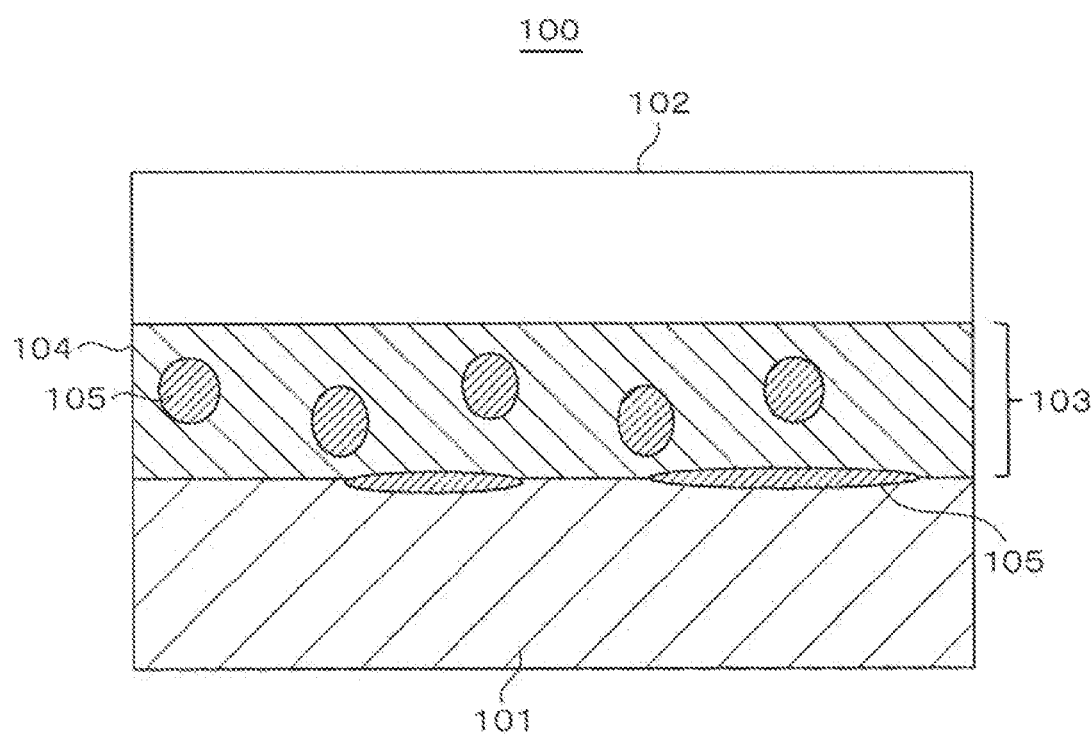
FIG. 10 is a sectional view of a jointed body according to an embodiment of the invention.

FIG. 10 is a sectional view of a jointed body according to an embodiment of the invention. The jointed body, which is a structure 100, is a product wherein base members 101 and 102 are jointed to each other. At least one of these base members (i.e., the first base member 101) is a ceramic, semiconductor or glass base member. The base members are jointed to each other through a jointing layer 103. The jointing layer 103 is composed of a metal 104 and an oxide 105, and the oxide 105 contains V (vanadium) and Te (tellurium). The metal 104 inside the jointing layer 103, and the base member 101 are jointed to the ceramic, semiconductor or glass base member through the oxide 105 having the above-mentioned composition. When the base member 101 is made of a nitride, the oxidization of a surface of the base member 101 may cause the surface to gain a high joint strength. In this case, the base member 101 should be interpreted to contain the surface oxide layer. This surface oxide layer needs only to be a layer made mainly of the oxide on the surface to have a thickness of 0.1 to 5 μm.

When the base member is subjected to any surface processing, the base member should be interpreted to contain the resultant modified or reformed surface layer.

In the jointing layer 103, the interface between the metal 104 and the oxide 105 is not very strong. Thus, when the oxide 105 aggregates, the resultant aggregating region is brittle. It is therefore preferred that the form of the inside of the jointing layer 103 is such a form that the oxide 105 is dispersed in the metal 104.

When the base members 101 and 102 to be jointed to each other are largely different from each other in thermal expansion coefficient, there may arise a problem that the base members may be peeled off from each other by heat cycles. In this case, by dispersing voids in the jointing layer 103, thermal stress therein is relieved so that the base members can be heightened in resistance against heat cycles.

The formation of the jointing layer 103 may be attained by adding an appropriate solvent to a glass composition containing V and Te, and metal particles to make these components into a pasty form, painting the paste onto one or both of the base members, or by sandwiching, between the base members, a metal foil piece in which glass particles are embedded, and then heating the sandwich. The formation may be attained by sandwiching, between the base members, a lamellar body composed of a metal sheet and a glass piece, and then heating the sandwich.

When P (phosphorous) besides V and Te is incorporated into the glass composition for forming the jointing layer 103, the resultant comes to have a glass transition temperature of about 230 to 340° C. and a softening/flowing point of about 350 to 450° C. Thus, the base members can gain a joint high in heat resistance therebetween. When Ag (silver) besides V and Te is incorporated into the glass composition, the resultant comes to have a glass-transition temperature of about 160 to 270° C. and a softening/flowing point of about 210 to 350° C. Thus, the base members can be jointed to each other at low temperature. In the same manner as any solder, the jointing layer can be caused to take charge of thermal conduction and electrical conduction.

The oxide before the jointing is in a glass (glass composition) state. However, the oxide after the jointing does not necessarily need to keep the glass state. The oxide may be changed to a different substance by self-crystallization of the glass or reaction of the glass with the metal in the base member (s) or in the jointing layer. When the melting point of the substance obtained after the crystallization or the change is high in this case, the joint is improved in heat resistance. However, the substance obtained after the crystallization or the change may be brittle to lower the joint strength. In this case, Fe (iron), Sb (antimony), W (tungsten), Ba (barium), and/or K (potassium) is/are appropriately incorporated into the glass composition, thereby causing the composition to keep a glass structure therein more stably to prevent the joint strength from being lowered.

About the glass composition made mainly of V, Te and P, Te and P are components for vitrification. When the composition contains these components, the composition can easily be caused to soften/flow even by irradiation with electromagnetic waves. P is effective for making the composition small in thermal expansion. However, if the content by percentage (% by mass) of P is made larger than that of tellurium in terms of respective oxides thereof, that is, the content by percentage (% by mass) of $P_2O_5$ (diphosphorous pentaoxide) is made larger than that of $TeO_2$ tellurium dioxide), the composition is apt to become high in glass-transition temperature ($T_g$). It is therefore preferred to make the content by percentage of $P_2O_5$ equal to or less than that of $TeO_2$.

About the glass composition made mainly of V, Te and Ag, the respective contents by percentage of V, Te and Ag are set, in terms of respective oxides thereof, to satisfy $V_2O_5$ (vanadium pentaoxide)+$TeO_2$+$Ag_2O$ (silver (I) oxide)≥85% by mass. In this case, the glass composition can attain the compatibility of a particularly low softening/flowing point with a stable glass structure.

Te and P are components for vitrification. When the glass composition contains these components, the composition can easily be caused to soften/flow even by irradiation with electromagnetic waves. P is effective for making the composition small in thermal expansion. However, if the content by percentage (% by mass) of P is made larger than that of tellurium in terms of respective oxides thereof, that is, the content by percentage (% by mass) of $P_2O_5$, is made larger than that of $TeO_2$, the composition is apt to become high in glass-transition temperature ($T_2$). It is therefore preferred to make the content by percentage of $P_2O_5$ equal to or less than that of $TeO_2$.

Examples of a ceramic material used for the base member 101 to be jointed include aluminum oxide, aluminum nitride, and silicon nitride. Examples of a semiconductor used therefor include silicon, and silicon carbide. Even when the base member to be jointed is a metal base member, the base member can be satisfactorily jointed. A ceramic material or semiconductor is generally different in thermal expansion coefficient from any metal; consequently, when a base member of a ceramic material or semiconductor is jointed to the metal, the resultant is weak against heat cycles. However, in the jointed body of the invention, a larger thermal stress caused by a large difference between the thermal expansion coefficients is relieved by the metal constituting the jointing layer, or voids dispersed in the metal. This matter would make the jointed body strong against heat cycles.

Examples of the metal 104 used to form the jointing layer include Ag, Cu (copper), Al, Sn (tin), Zn (zinc), Au (gold), In (indium), Bi (bismuth), and Pt (platinum); and any alloy containing one or more of these metals.

The above-mentioned class composition is made lead-free in the consideration for she environment. The word "lead-free" referred to in connection with the invention is a word intending to permit the following: the glass composition contains any hazardous substance in the RoHS (Restriction of Hazardous Substances) Directive enforced on and from Jul. 1, 2006 in an amount not more than a designated value thereof according to the Directive.

Example 1

Glass Compositions

A description will be made about a method for producing each glass composition used for a joint material. Starting materials therefor were weighed to satisfy predetermined weight proportions in accordance with Table 1. The used starting materials were each an oxide powder (purity: 99.9%) manufactured by Kojundo Chemical Lab. Co., Ltd. However, for some of the samples, Ba $(PO_3)_2$ (barium/metaphosphate) (manufactured by RASA Industries, Ltd.) was used as sources for Ba and P. The aforementioned starting materials were mixed with each other, and the mixture was put into a platinum crucible. However, when the proportion of $Ag_2O$ in the raw materials was 40% or more by mass, an alumina crucible was used. For the mixing, a metallic spoon was used and the mixing was attained in the crucible in consideration for avoiding an extra absorption of humidity into the raw material powders. The crucible in which the mixed raw material powders were put was set into a glass melting furnace, and heated to be melted. The temperature thereof was raised at a temperature-raising rate of 10° C./min, and at a set temperature of 700 to 950° C., the melted glass was kept for 1 hour while stirred. Thereafter, the crucible was taken out from the glass melting furnace, and then the glass was cast (melted and caused to flow) into a graphite casting mold heated beforehand to 150° C.

Next, the cast glass was shifted to a strain relieving furnace, heated beforehand to the strain point, and kept for 1 hour to remove the strain. Thereafter, the glass was cooled to room temperature at a rate of 1° C./min. The glass cooled to room temperature was roughly smashed to produce a frit made of the glass composition. The mean volume diameter of the frit of the glass composition was 20 μm or less. The glass-transition temperature thereof was measured by DTA (differential thermal analysis). The DTA is a method of changing the temperature of a sample and that of a reference substance in accordance with a predetermined program, and simultaneously measuring a difference in temperature between she sample and the reference substance as a function of time.

Table 1 shows properties of the glass compositions according to she present example. In this table, the respective glass-transition temperatures are shown. A measuring method thereof is as follows: Each of the produced glasses was smashed until the mean volume diameter thereof turned to 20 μm or less. At a temperature-raising rate of 5° C./min, the smashed glass was subjected to differential thermal analysis until the temperature turned to 550° C., so as to measure the glass-transition temperature ($T_g$). As a reference sample, alumina powder was used; and as a sample vessel, an Al vessel was used. FIG. 1 shows a DTA curve of a typical example of the glass compositions. As shown in FIG. 1, the glass-transition temperature ($T_g$) is defined as the initiation point of a first endothermic peak. Additionally, the deformation point ($T_d$) is gained as the first endothermic peak; the softening point ($T_s$) as a second endothermic peak temperature; and the initiation point ($T_c$) of an exothermic peak as the crystallization temperature. The jointing temperature depends on various factors such as the particle diameter of particles of the glass, and pressure conditions and the jointing-operation retention period when the base members are jointed to each other. Thus, the temperature cannot be decided without reservation. However, it is necessary to heat the glass composition up to a temperature higher than the softening point ($T_s$) corresponding to a viscosity of $10^{7.65}$ poises. The softening point ($T_s$) is a temperature higher than the glass-transition temperature ($T_g$) by a temperature of about 50 to 100° C.

In Table 1 are shown the composition of each of the glass compositions, and the glass-transition temperature thereof. As understood from the glass compositions Nos. 1 to 10 in the table, by incorporating V, Te and P into a glass composition and causing the respective contents by percentage (% by mass) of oxides thereof to satisfy the following relationship expression: $V_2O_5>TeO_2>P_2O_5$ (% by mass), the glass-transition temperature of the composition can be adjusted to a low value of 250 to 340° C. As understood from the glass compositions Nos. 11 to 31 in the table, by incorporating Ag, Te and V into a glass composition, and adjusting the total content by percentage (% by mass) of respective oxides thereof, $Ag_2O$, $V_2O_5$ and $TeO_2$, to 85% or more by mass, the glass-transition temperature of the composition can be adjusted to a very low value of 160 to 270° C.

TABLE 1

| Glass No. | Glass composition (% by mass) | | | | | | | | | Glass-transition temperature [° C.] |
|---|---|---|---|---|---|---|---|---|---|---|
| | $V_2O_5$ | $TeO_2$ | $Fe_2O_3$ | $P_2O_5$ | $Ag_2O$ | $WO_3$ | BaO | $Sb_2O_3$ | $K_2O$ | |
| 1 | 50 | 32 | 10 | 8 | — | — | — | — | — | 263 |
| 2 | 50 | 30 | 10 | 6 | — | 4 | — | — | — | 257 |
| 3 | 45 | 30 | 15 | 10 | — | — | — | — | — | 308 |
| 4 | 45 | 25 | 15 | 10 | — | 5 | — | — | — | 316 |
| 5 | 43 | 30 | 15 | 12 | — | — | — | — | — | 318 |
| 6 | 37 | 33 | 19 | 11 | — | — | — | — | — | 336 |
| 7 | 38 | 30 | — | 5.8 | — | 10 | 11.2 | — | 5 | 276 |
| 8 | 55 | 20 | — | 10 | — | — | 5 | 10 | — | 313 |
| 9 | 45 | 25 | — | 10 | — | — | 5 | 15 | — | 338 |
| 10 | 45 | 30 | — | 10.3 | — | 10 | 4.7 | — | — | 286 |
| 11 | 30 | 30 | — | 4.8 | 30 | — | 5.2 | — | — | 222 |
| 12 | 30 | 30 | — | 5 | 30 | 5 | — | — | — | 230 |
| 13 | 25 | 30 | — | 4.8 | 30 | 5 | 5.2 | — | — | 223 |
| 14 | 25 | 30 | — | 7.2 | 30 | — | 7.8 | — | — | 228 |
| 15 | 30 | 30 | — | 4.8 | 25 | 5 | 5.2 | — | — | 236 |
| 16 | 30 | 30 | 5 | 5 | 30 | — | — | — | — | 235 |
| 17 | 25 | 30 | 5 | 10 | 30 | — | — | — | — | 266 |
| 18 | 25 | 30 | 5 | 5 | 30 | 5 | — | — | — | 249 |
| 19 | 25 | 30 | — | 5 | 30 | 10 | — | — | — | 236 |
| 20 | 30 | 30 | — | 4.8 | 25 | 5 | 5.2 | — | — | 237 |
| 21 | 20 | 30 | — | 4.8 | 35 | 5 | 5.2 | — | — | 204 |
| 22 | 17 | 30 | — | 4.8 | 38 | 5 | 5.2 | — | — | 197 |
| 23 | 17 | 30 | — | — | 43 | 5 | 5 | — | — | 177 |
| 24 | 20 | 35 | — | — | 45 | — | — | — | — | 163 |
| 25 | 17 | 40 | — | — | 43 | — | — | — | — | 169 |
| 26 | 40 | 40 | — | — | 20 | — | — | — | — | 218 |
| 27 | 20 | 30 | — | — | 45 | 5 | — | — | — | 169 |
| 28 | 45 | 30 | — | — | 20 | 5 | — | — | — | 224 |
| 29 | 40 | 35 | — | — | 25 | — | — | — | — | 212 |
| 30 | 18 | 34 | — | — | 43 | — | 5 | — | — | 167 |
| 31 | 40 | 25 | — | — | 35 | — | — | — | — | 235 |

<Pastes>

Jointed bodies were produced. Herein, a description will be made about a method for producing a paste for the production of each of the jointed bodies. About each of the glass compositions Nos. 1 to 10, the paste was a paste composed of the frit (powdery glass) of the glass composition, metal particles and a solvent. First, the frit of the glass composition was smashed by a let mill into a mean volume diameter of 2 μm or less. Subsequently, the glass composition was mixed with the metal particles at a predetermined blend ratio. For the mixing, an agate crucible was used. A solvent to which a resin binder was added into a concentration of 4% was mixed with the resultant mixture to make these components into a pasty form. As the resin binder, ethyl cellulose was used; and as the solver, butyl carbitol acetate was used. Butyl carbitol acetate hardly reacts with the glass compositions Nos. 1 to 10. However, only by the use of the solvent, the resultant paste should be lower in viscosity to be poor in paintability. Thus, the addition of the resin binder was performed. For reference, ethyl cellulose is heated to about 300° C., thereby being volatilizable. Thus, by the heating, the cellulose can be removed without causing the glass compositions Nos. 1 to 10 to soften/flow. Accordingly, the paste using each of the glass compositions Nos. 1 to 10 is painted onto a base member to be jointed, and then heated to about 300° C. to remove the solvent and the resin binder. In this way, the paste is usable.

Separately, only a solvent was mixed with each of the glass compositions Nos. 11 to 31 to make the composition into a pasty form. The used solvent was α-terpineol. α-terpineol hardly reacts with each of the glass compositions Nos. 11 to 31, and further has a relatively high viscosity. Thus, even when no binder was added to the composition, the resultant paste had a good paintability. α-terpineol reacts with the glass compositions Nos. 1 to 10. Thus, α-terpineol is not usable as a solvent therefor. When α-terpineol is heated to about 100 to 150° C., this compound can be volatilized. Thus, the compound can be removed without causing the glass compositions Nos. 11 to 31 to soften/flow.

<Jointed Body Forms>

FIG. 2 each schematically illustrate a jointed body according to the invention. The structure illustrated in each of FIG. 2 is a structure in which a base member 1 is jointed to another base member 3 through a joint material layer 2. Either of the base member 1 or 3 is a ceramic material, semiconductor or glass base member. The form or constitution of the joint is not limited to one type. The constitution may be any one of a constitution as illustrated in FIG. 2A, wherein the respective entire surfaces of base plates (as the base members) having the same shape are jointed to each other; a constitution as illustrated in FIG. 2B, wherein base plates are jointed to each other to have a space inside the plates; a constitution as illustrated in FIG. 2C, wherein base plates having different sizes are jointed to each other; and a constitution as illustrated in FIG. 2D, wherein the base members at least one of which is not in a plate form are jointed to each other.

<Samples and Evaluating Method>

Figure 2A:
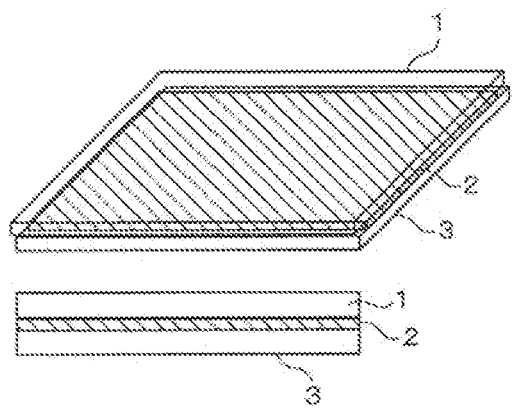
FIGS. 2A, 2B, 2C, and 2D are each a schematic view of an example of the jointed body of the invention.
Figure 2B:
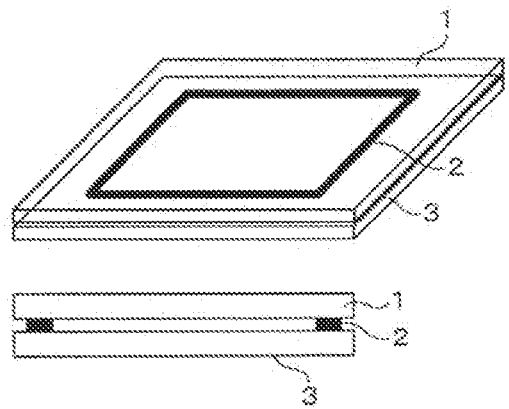
Figure 2C:
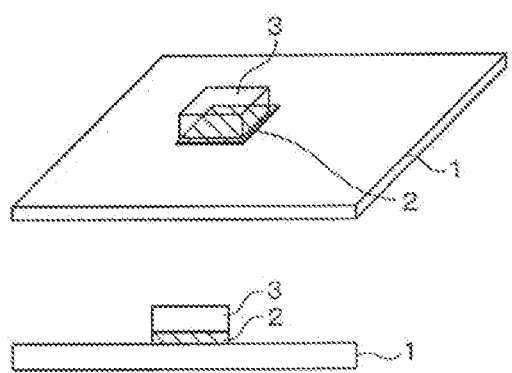
Figure 2D:
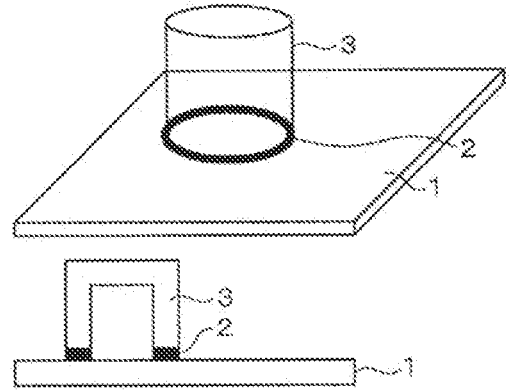
Figure 3A:
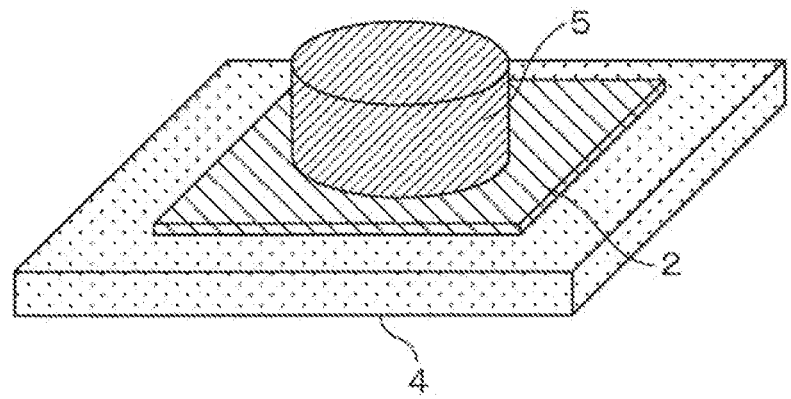
FIGS. 3A, and 3B are each a view illustrating a sample for evaluating jointing performance.
Figure 3B:
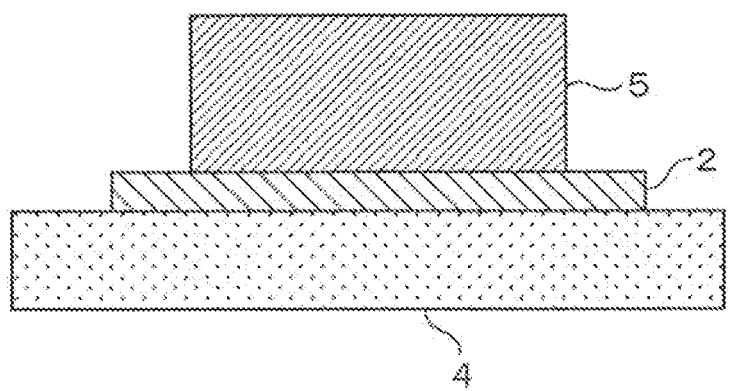

A sample as illustrated in FIG. 3 is used in a simple test described below for evaluating the joint performance thereof. FIG. 3A is a perspective view of an external appearance of the evaluating sample, and FIG. 3B is a sectional view of the sample. A base member 4 is in a plate form, and is made of a ceramic material, a semiconductor or a glass. A base member 5 is in the form of a column of 2 mm thickness and 5 mm diameter, and is made of any material.

In the test that is a strength test, a maximum strength required for breaking out the sample by applying a tool onto a side of the base member 5 is measured. The joint strength in shear is defined as a value obtained by dividing the strength by the joint area between the base members 4 and 5, that is, 20 mm².

To evaluate the jointed body, a sample having a cross section as illustrated in FIG. 3B is formed, and a microstructure thereof is observed through a scanning electron microscope. The sample cross section is wet polished with a waterproof abrasive paper sheet, and then subjected to buff polishing with alumina powder. The cross section is finished into a smooth state by argon ion milling.

<Jointed Bodies>

In each jointed body according to the present example, the following were used: a base member 4a of aluminum oxide, which is an example of ceramic material; and a base member 5a of oxygen-free copper, which is an example of metal. About its joint, material, as its glass composition, the glass composition No. 1 in Table 1 was used; and as its metal particles, Ag particles having a particle diameter of 1 μm were used. Hereinafter, a description will be made about a method for producing each of the jointed bodies according to the present example.

The proportion of the glass composition in the total volume of the metal particles and the glass composition is defined as the added glass quantity $X_G$. The metal particles were mixed with the glass composition to give $X_G$ values of 0, 5, 10, 20, 30, and 50% by volume, respectively. Thereafter, to each of the resultants was added an appropriate amount of a mixture of butyl carbitol acetate, and ethyl cellulose, the proportion of which was 4% by weight, to make these components into a pasty form. The resultant pastes were each painted onto the aluminum oxide base member 4a. The workpiece was heated to 150° C. on a hot plate to volatilize butyl carbitol acetate so as to be removed. Thereafter, the workpiece was heated to 350° C. to remove ethyl cellulose so as to be removed. The oxygen-free copper base member 5a was put onto the painted film, and then the workpiece was heated to 400° C. in nitrogen. Throughout the heating, a weight was put on the oxygen-free copper base member 5a, and the workpiece was pressured at a pressuring force of 1 MPa. Herein, the pressuring force is defined as a value obtained by dividing the weight value of the weight by the joint area, that is, 20 mm².

Figure 4:
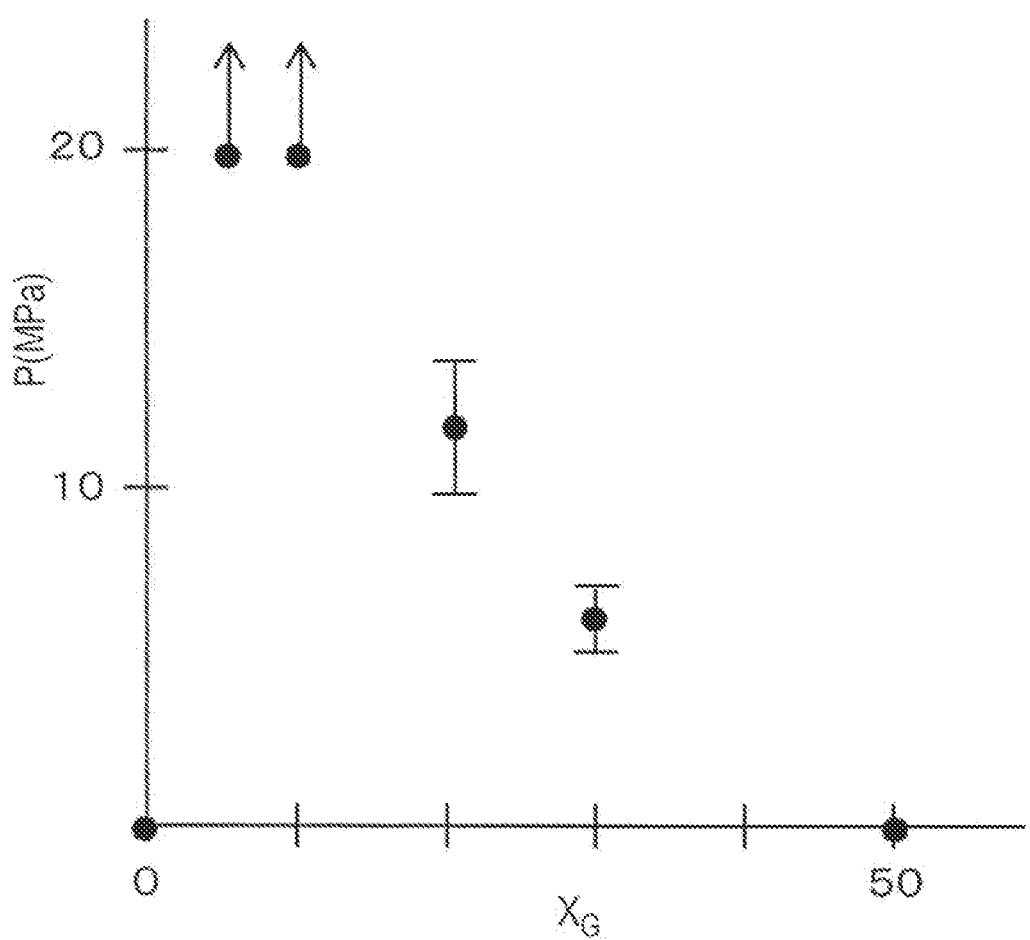
FIG. 4 is a graph showing joint strength test-results of jointed bodies according to Example 1.

The jointed bodies obtained by the above-mentioned production method were each evaluated, about the joint strength thereof in shear. FIG. 4 is a graph showing joint strength test-results of the jointed bodies according to Example 1. In FIG. 4 is shown a relationship between the added quantity $X_G$ of the glass composition into the paste and the joint strength P in shear. When $X_G$ was 0% by volume, P was approximately zero. Thus, before the strength test, the base members of the sample were peeled off from each other. When $X_G$ was 5 or 10% by volume, a high joint strength more than 20 MPa in shear was obtained. Because of a restriction based on the evaluating device, the test was stopped before P became more than 20 MPa so that the sample was broken out. Such cases are each shown by an upward arrow in FIG. 4. When $X_G$ was 20% or more by volume, P tended to decrease as $X_G$ increased. When $X_G$ was 50% by volume, the base members of the sample were again peeled off before the strength test. When $X_G$ was any one of 0% and 50% by volume, that is, when the base members were not jointed to each other, the joint material layer 2a and the aluminum oxide base member 4a were peeled off from each other.

Figure 5A:
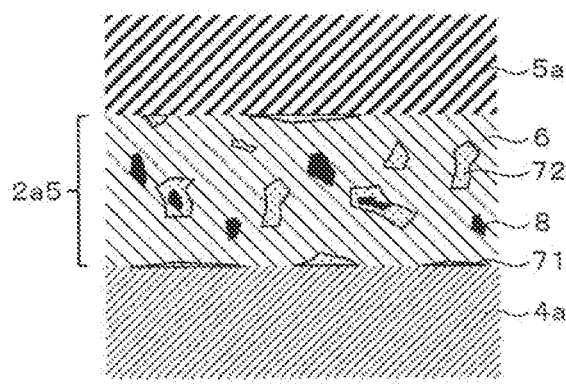
FIGS. 5A, 5B, and 5C are each a sectional view of one of the jointed bodies according to Example 1.
Figure 5B:
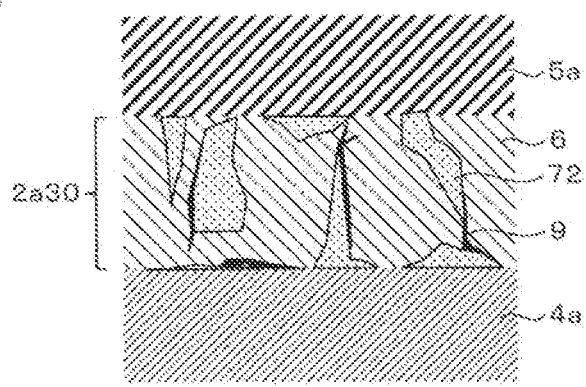
Figure 5C:
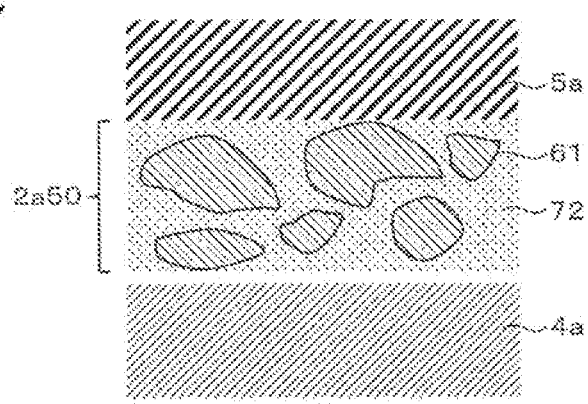

FIG. 5 are respective sectional views of the jointed bodies according to Example 1. In FIG. 5 are shown sectional microstructures obtained by observing the samples when $X_G$ was 5, 30 and 50% by volume, respectively, through an electron microscope. As illustrated in FIG. 5A, when the $X_G$ was 5% by volume, metal particles were strongly bonded to each other in a joint material layer 2a5 so that a dense sintered metal 6 was formed. Between the sintered metal 6 and she aluminum oxide base member 4a, many regions were jointed to each other through a thin oxide layer 71 having a thickness of 100 nm or less. Moreover, the jointed body had a structure wherein an oxide 72 and voids 8 were dispersed in the sintered metal 6. Furthermore, between the sintered metal 6 and the aluminum oxide base member 4a, many regions were jointed to each other through a thin oxide layer 72 having a thickness of 100 nm or less. When the oxides 71 and 72 were subjected to elementary analysis by means of an SEM-EDX, V, Te, P and Fe were detected. It is presumed that these regions originated from the glass composition. The SEM-EDX is a machine of using an energy dispersive X-ray spectrometer attached to a scanning electron microscope (SEM) to observe an image through the SEM, and simultaneously applying elementary analysis to a visual field thereof. From X-rays obtained by radiating an electron beam onto a sample, the species of elements therein are identified. However, the sample does not necessarily need to keep a glass (amorphous) structure nor to have a simple composition. Actually, the oxide 71, as well as the oxide 72, was varied in contrast at its individual sites. Angular microstructures, which appeared to be crystal, were observed in partial regions of the oxides. As illustrated in FIG. 5B, when $X_G$ was 30% by volume, an oxide 72 dispersed inside, a sintered metal 6 of a joint material layer 2a30 became large in size, and further cracks 9 were observed near the interface between the sintered metal 6 and the oxide 72. Furthermore, as illustrated in FIG. 5C, when $X_G$ was 50% by volume so that the proportion of glass was large, a joint material layer 2a50 was in such a form that metal particles 61 were dispersed inside a matrix of an oxide 72.

The range of $X_G$ in which a high-strength jointed body can be gained is not decided without reservation since the range is affected by many parameters, such as components of the used glass composition, the material and the particle diameter of the metal particles, and temperature conditions and pressuring force at the time of the jointing. However, the above-mentioned results suggest that when a jointed body gains a high joint strength, the jointed body has the following characteristics:

(1) The metal particles are sufficiently bonded to each other so form a sintered metal.

(2) The sintered metal is jointed to the aluminum oxide base member through a very thin oxide layer, and the oxide contains components of the glass composition.

(3) The oxide and voids in the joint material layer are present in the state of being dispersed in the sintered metal.

There are a case where the presence of an oxide and voids in the joint material layer gives a good result, and a case where the absence of any oxide and voids in the joint material layer gives a good result.

Modified Example 1

In a jointed body according to the present modified example, a base member 4b of aluminum nitride, which is an example of ceramic material, and a base member 5a of oxygen-free copper were used. However, the joint material, and a method for producing the jointed body were the same as in Example 1. The very same investigations as in Example 1 were made. However, the added quantity $X_G$ of the glass composition was adjusted only to 10% by volume in light of the results of Example 1.

Figure 6:
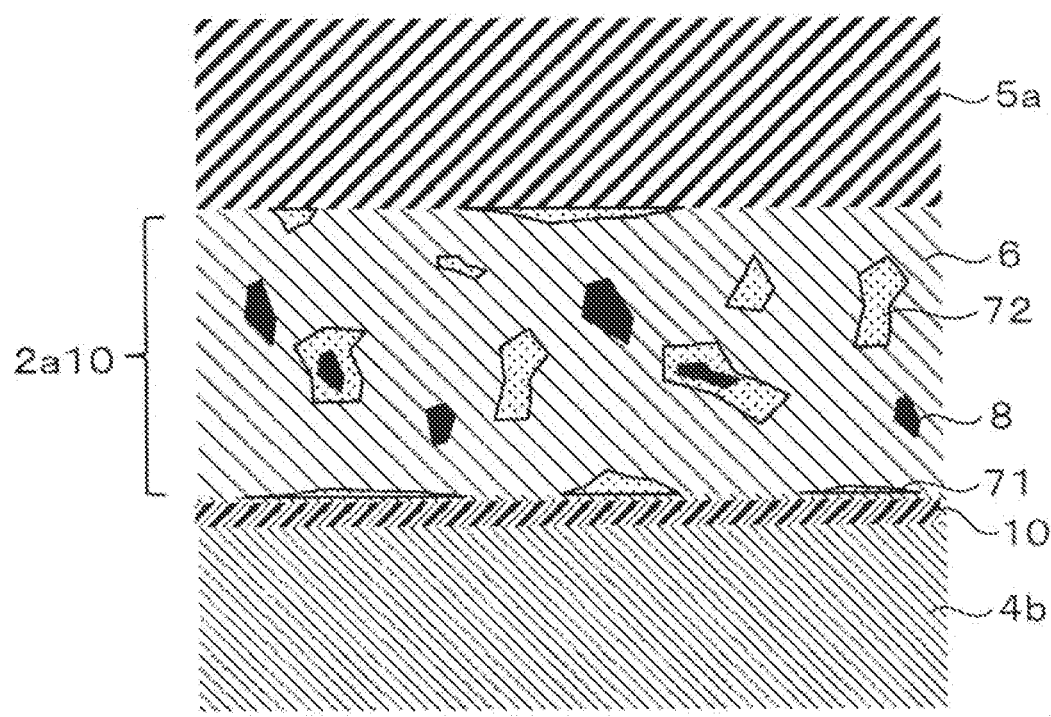
FIG. 6 is a sectional view of a jointed body according to Modified Example 1.

FIG. 6 is a sectional view of the jointed body according to Modified Example 1. Results of the strength test thereof demonstrated that the joint strength in shear was 13 MPa and thus a relatively strong joint was gained. However, the joint strength was lower as compared with that of Example 1. Between an aluminum nitride base member 4b and a joint material layer 2b10, peel was caused. Thus, the jointed body was thermally treated at 1100° C. in the atmosphere for 1 hour, thereby forming an aluminum oxide layer 10 of about 1 μm thickness on the front surface of the aluminum nitride base member 4b to joint the base member 4b to the oxygen-free copper base member 5a. As a result, the joint strength in shear was more than 20 MPa, which was equivalent to that of Example 1. A cross section of the jointed body at this time has been schematically shown in FIG. 6.

Accordingly, in the case of a nitride base member, the joint strength is lowered. However, by making the front surface thereof into an oxide, this base member can gain a joint strength equivalent to that of any oxide base member. In the case of forming, onto the front surface of a base member, a layer of a different substance beforehand by pretreatment, such as the above-mentioned thermal treatment, the base member including the layer of the different substance is called the base member herein.

Example 2

Figure 7:
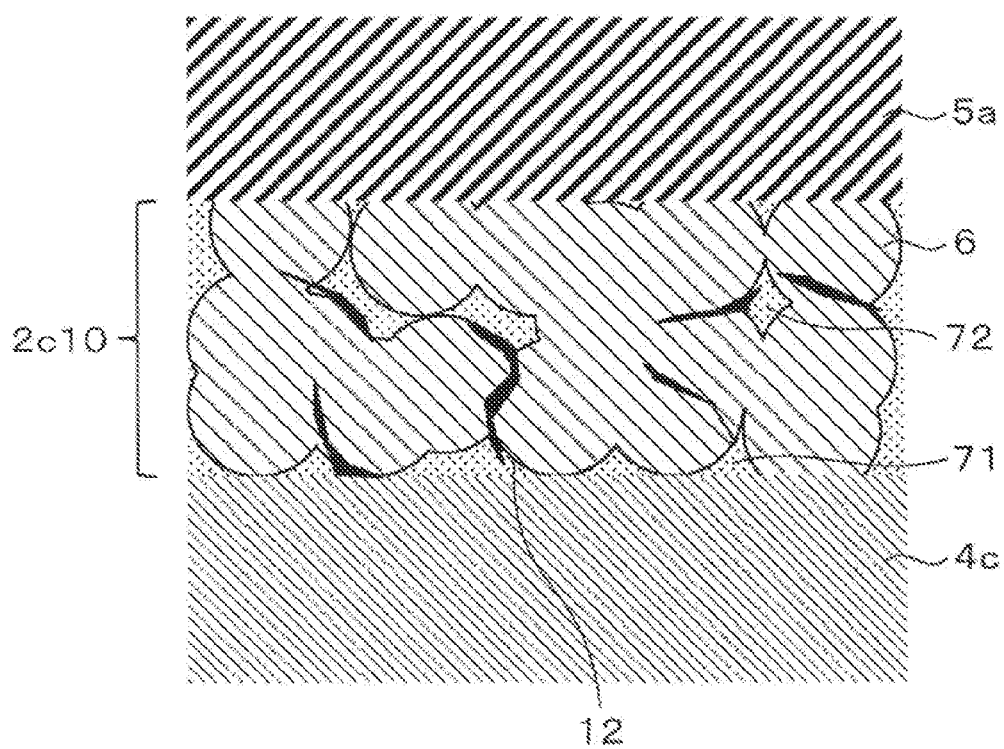
FIG. 7 is a sectional view of a jointed body according to Example 2.

In a jointed body according to the present example, a soda glass base member 4c and an oxygen-free base member 5a were used. As a glass composition, the composition No. 27 in Table 1 was used; and as metal particles, "Sn"-"3.5%-by-mass-Ag" particles of 50 μm particle diameter were used. FIG. 7 is a sectional view of the jointed body according to Example 2. Hereinafter, a description will be made about, a method for producing the jointed body according to the present example.

Considering the results in Example 1, the glass composition was added to the metal particles to give a concentration of 10% by volume, and then thereto was added α-terpineol to make these components into a pasty form. The resultant paste was painted onto a glass plate having a thickness of 1 mm and having each side of 10 mm length. The workpiece was heated on a hot plate to 150° C. to volatilize butyl carbitol acetate, and then an oxygen-free copper base member 5a was put onto the painted film. Thereafter, the workpiece was heated to 300° C. in the atmosphere to joint the two base members to each other. In Example 1, it was necessary to adjust the jointing temperature for the glass to 400° C. since the softening point of the glass was high. Thus, the workpiece was heated in nitrogen to restrain the oxidization of the copper. However, in this example, the softening point of the glass was low; thus, the jointing temperature was adjusted to 300° C., and the jointing was attained in the atmosphere. Throughout the heating, a weight was put onto the workpiece to apply a pressure of 0.1 MPa thereto. As a result, as shown in FIG. 7, a jointed body was obtained wherein a soda glass base member 4c, as the afore-mentioned base member, was jointed to the oxygen-free copper base member through a joint material layer 2c10.

The joint strength in shear of the joint bodies obtained by the afore-mentioned producing method is 12 MPa. Thus, a relatively strong joint is obtained. A sectional microstructure of the joint bodies is as shown in FIG. 7. This was a structure wherein a metal bulk 6c in which the metal particles were strongly bonded to each other was formed, and particles of an oxide 72 were dispersed therein. As compared with Example 1, Example 2 was smaller in the quality of voids. This was because the melting point of "Sn"-"3.5%-by-mass-Ag" was as low as 220° C. so that the alloy came to be jointable in the state of a liquid phase. A large quality of an oxide 12 of Sn inside a joint material layer 2 was recognized. This appeared to be because a surface oxide film of the metal particles as raw material remained.

Modified Example 2

The oxide of Sn which caused a fall in the strength in Example 2 originated from the surface oxide of the "Sn"

Figure 8A:
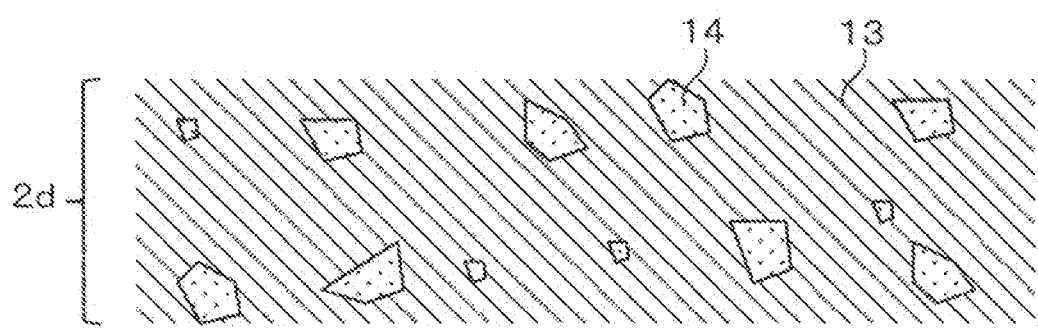
FIGS. 8A, and 8B are respective sectional views of foil-form joint materials according to Modified Examples 2 and 3.

"3.5%-by-mass-Ag" particles. Thus, it was conceived that the supply of a joint material in a foil form would make the joint strength better. Thus, a "Sn"-"3.5%-by-mass-Ag" foil piece of 100 µm thickness was produced, and then the glass powder No. 27 was put onto the foil piece. The workpiece was rolled to produce a joint material 2d as illustrated in FIG. 8. FIG. 8A is a sectional view of the foil-form joint material according to Modified Example 2. As illustrated in FIG. 8A, a sectional microstructure of the joint material 2d after the rolling was a structure wherein glass particles 14 were dispersed in "Sn"-"3.5%-by-mass-Ag". Many of the glass particles 14 were present near the surfaces of the metal foil piece, which is a foil piece 13.

The thus produced "Sn"-"3.5%-by-mass-Ag" foil piece (joint material 2d) was sandwiched between a soda glass base member 4c and an oxygen-free copper base member 5a, and the sandwich was heated to 300° C. in the atmosphere to joint the base members. By putting a weight thereon throughout the heating, a pressure of 0.1 MPa was applied thereto. As a result, the quantity of the Sn oxide was largely decreased so that a joint strength of 20 MPa or more in shear was obtained. Such a supply of a joint material in a foil form makes it possible to exclude any effect of a surface oxide layer of its metal particles and further remove the step of volatilizing any solvent to be removed, as compared with the supply thereof in a pasty form. Thus, the former supply is effective for making the entire process simpler.

Modified Example 3

Figure 8B:
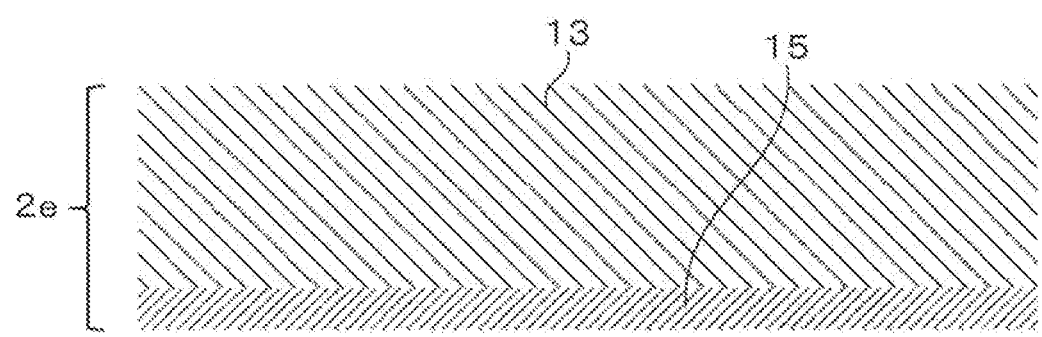

The foil-form joint material of Modified Example 2 does not necessarily need to be a material wherein particles of a glass are dispersed in a metal. FIG. 8B is a sectional view of a foil-form joint material according to Modified Example 3. As illustrated in FIG. 8B, the joint material of the invention may be, for example, in a form that a thin layer 15 of a glass is formed on a surface of a metal foil piece 13. This form makes in possible to supply the glass, for example, only to a base member to which the glass is more easily jointed than metal, out of base members.

Such a form can be produced by putting a glass piece in a plate form onto a metal in a plate form, and then rolling the workpiece at a temperature somewhat lower than the softening point of the glass. Any glass is continuously changed in viscosity with a change in temperature; thus, by adjusting a piece of the glass to a temperature that does not permit the shape thereof to be lost bus permits the piece to be deformed, the rolling can be attained.

Modified Example 4

Additionally, the inventors evaluated the jointing performance of the joint material of the invention to semiconductors such as silicon nitride, silicon and silicon carbon, as well as ceramic materials such as aluminum oxide and aluminum nitride, and glasses such as soda glass. As a result, it was verified that the joint material was good in the jointing performance. It was also verified that the joint material was good in jointing performance to each of aluminum, and a composite material of a metal and a ceramic material (Al—SiC), as well as the oxygen-free copper base member, as a base member counter to the base member described just above.

The metal to be used in the joint material may be Ag, Cu, Al, Sn, Zn, Au, In, Bi, Pt or some other, as well as Ag or "Sn"-"3.5%-by-weight-Ag". In particular, any noble metal has an advantage of being inclined not to be easily oxidized even when the joint material is used for jointing in she atmosphere. Any low-melting-point metal has an advantage of causing the joint material to attain good jointing even when the pressure for the jointing is made small.

Example 3

Figure 9:
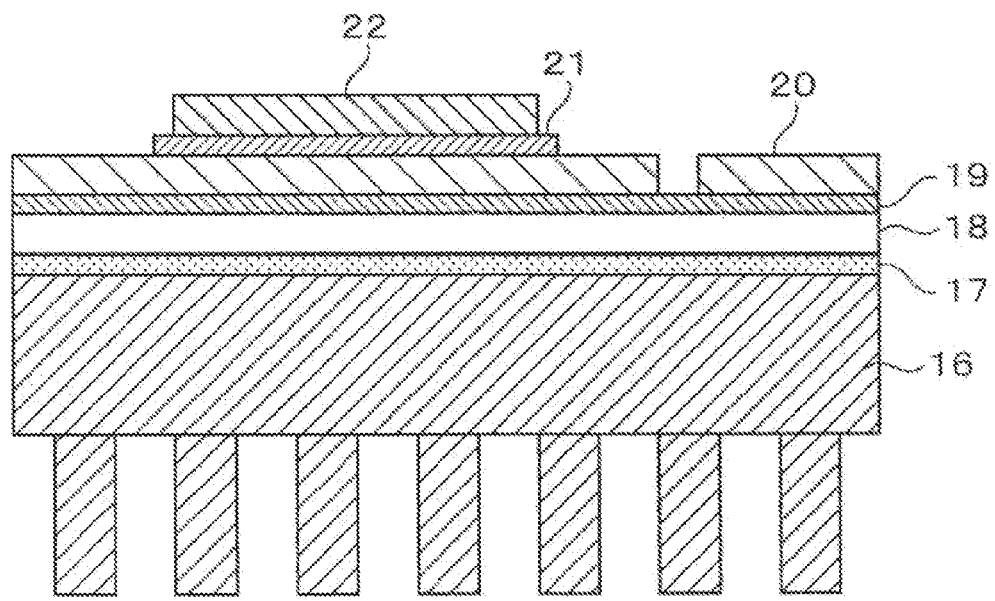
FIG. 9 is a sectional view of a semiconductor module according to Example 3.

The joint materials and the jointed bodies described in Example 1, Modified Example 1, Example 2, and Modified Examples 2, 3 and 4 are each applicable to, for example, various joint spots in semiconductor modules. FIG. 9 is a sectional view of a semiconductor module according to Example 3. In the semiconductor module of the present example, any one of these materials and bodies is applied to a joint material 17 between a fin-attached base plate 16 of a metal or Al—SiC, and a ceramic insulating substrate 18, a joint material 19 between the ceramic insulating substrate 18 and a metal wire 20, a joint material 21 between the metal wire 20 and a silicon chip 22, and others. Any one of these materials and bodies is also applicable to a joint between a chip and a base plate of an LED illuminator.

The above has specifically described the invention made by the inventors by way of the embodiments, the examples and the modified examples. However, the invention is not limited to the embodiments, the examples and the modified examples and may be, of course, changed into various forms.

What is claimed is:

1. A jointed body, comprising:
   a first base member;
   a second base member; and
   a joint material layer for jointing the first base member and the second base member to each other,
   wherein the first base member is any one selected from the group consisting of a ceramic base member, a semiconductor base member and a glass base member,
   the joint material layer comprises a metal and an oxide having a thickness of no more than 100 nm present between the first base member and the metal,
   the oxide is a lead-free glass composition including V, Te, and Ag, in terms of respective oxides thereof, so as to satisfy $100\% > V_2O_5 + TeO_2 + Ag_2O \geq 85\%$ by mass,
   the oxide is present in at least one part of a space between the first base member and the metal,
   voids are dispersed in the metal,
   the lead-free glass composition includes $TeO_2$ of 25% to 40% by mass, as well as $V_2O_5$ and $Ag_2O$, and
   the oxide is dispersed in the metal.

2. The jointed body according to claim 1, wherein the oxide comprises at least one element selected from the group consisting of Sb, Ba, W, Fe and alkali metals.

3. The jointed body according to claim 1, wherein the first base member is a base member of any one selected from the group consisting of aluminum oxide, aluminum nitride, silicon nitride, silicon and silicon carbide, and the second base member is a metal base member, or a composite material base member of a metal and a ceramic material.

4. The jointed body according to claim 3, wherein the second base member is any one selected from the group consisting of a Cu base member, an aluminum base member and an Al—SiC base member.

5. The jointed body according to claim 1, wherein the first base member is at least one selected from the group consisting of an Al nitride base member, and a silicon nitride base member, and a layer made mainly of an oxide is formed on a surface of the first base member to have a thickness of 0.1 to 5 μm.

6. The jointed body according to claim 1, wherein the metal comprises at least one selected from the group consisting of Ag, Cu, Al, Sn, Zn, Au, In, Bi, and Pt.

7. The jointed body according to claim 1, wherein the glass composition comprises P in addition to V, Te, and Ag.

* * * * *